(12) United States Patent
Suzuki et al.

(10) Patent No.: US 11,195,858 B2
(45) Date of Patent: Dec. 7, 2021

(54) FERROELECTRIC MEMORY DEVICE

(71) Applicant: Kioxia Corporation, Minato-ku (JP)

(72) Inventors: Kunifumi Suzuki, Yokkaichi (JP); Masumi Saitoh, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/894,986

(22) Filed: Jun. 8, 2020

(65) Prior Publication Data

US 2021/0082956 A1    Mar. 18, 2021

(30) Foreign Application Priority Data

Sep. 13, 2019   (JP) .............................. JP2019-167604

(51) Int. Cl.
| | |
|---|---|
| *H01L 27/11597* | (2017.01) |
| *H01L 27/11587* | (2017.01) |
| *H01L 27/11582* | (2017.01) |
| *H01L 27/11507* | (2017.01) |
| *H01L 27/11585* | (2017.01) |
| *H01L 27/1158* | (2017.01) |
| *H01L 27/11514* | (2017.01) |
| *H01L 27/1159* | (2017.01) |

(52) U.S. Cl.
CPC .... *H01L 27/11597* (2013.01); *H01L 27/1158* (2013.01); *H01L 27/1159* (2013.01); *H01L 27/11507* (2013.01); *H01L 27/11514* (2013.01); *H01L 27/11582* (2013.01); *H01L 27/11585* (2013.01); *H01L 27/11587* (2013.01)

(58) Field of Classification Search
CPC ......... H01L 27/11507; H01L 27/11514; H01L 27/11572; H01L 27/1158; H01L 27/11582; H01L 27/11585; H01L 27/11587; H01L 27/1159; H01L 27/11597
USPC ........................................................ 257/314
See application file for complete search history.

(56) References Cited

U.S. PATENT DOCUMENTS

| | | | |
|---|---|---|---|
| 6,906,366 B2 | 6/2005 | Hsu et al. | |
| 7,226,795 B2 | 6/2007 | Sakai | |
| 2003/0068848 A1 | 4/2003 | Hsu et al. | |
| 2014/0339624 A1* | 11/2014 | Ramaswamy | ........ H01L 29/788 257/326 |
| 2015/0140753 A1* | 5/2015 | Simsek-Ege | ...... H01L 21/32139 438/268 |
| 2020/0035700 A1* | 1/2020 | Xu | ....................... H01L 23/5226 |

(Continued)

FOREIGN PATENT DOCUMENTS

| | | |
|---|---|---|
| JP | 2002-329847 A | 11/2002 |
| JP | 3909753 B2 | 4/2007 |
| JP | 4887481 B2 | 2/2012 |

*Primary Examiner* — Matthew E Warren
(74) *Attorney, Agent, or Firm* — Oblon, McClelland, Maier & Neustadt, L.L.P.

(57) ABSTRACT

Provided is a semiconductor memory device according to an embodiment including: a stacked body including gate electrode layers stacked in a first direction; a semiconductor layer provided in the stacked body and extending in the first direction; and a gate insulating layer provided between the semiconductor layer and at least one of the gate electrode layers, and the gate insulating layer including a first region containing a first oxide including at least one of a hafnium oxide and a zirconium oxide, in which a first length of the at least one of the gate electrode layers in the first direction is larger than a second length of the first region in the first direction.

9 Claims, 17 Drawing Sheets

(56) References Cited

U.S. PATENT DOCUMENTS

| | | | |
|---|---|---|---|
| 2020/0119030 A1* | 4/2020 | Dasgupta | H01L 21/0254 |
| 2020/0235244 A1* | 7/2020 | Doyle | H01L 29/7827 |
| 2020/0303558 A1* | 9/2020 | Fujii | H01L 27/11582 |
| 2021/0043654 A1* | 2/2021 | Yoo | G11C 11/223 |

* cited by examiner

BB' CROSS SECTION

AA' CROSS SECTION

BB' CROSS SECTION

AA' CROSS SECTION

FERROELECTRIC MEMORY DEVICE

CROSS-REFERENCE TO RELATED APPLICATION

This application is based upon and claims the benefit of priority from Japanese Patent Application No. 2019-167604, filed on Sep. 13, 2019, the entire contents of which are incorporated herein by reference.

FIELD

Embodiments described herein relate generally to semiconductor memory devices.

BACKGROUND

Ferroelectric memories have attracted attention as nonvolatile memories. In particular, since a one-transistor type memory cell having a metal ferroelectrics semiconductor (MFS) structure is suitable for high integration, and thus, the one-transistor type memory cell is expected to be applied to a large-capacity nonvolatile memory.

In a ferroelectric memory, there is a problem of degradation of memory cell characteristics due to polarization instability. It is preferable to increase polarization stability of the ferroelectric memory and to improve reliability of the ferroelectric memory.

DETAILED DESCRIPTION

Figure 1:
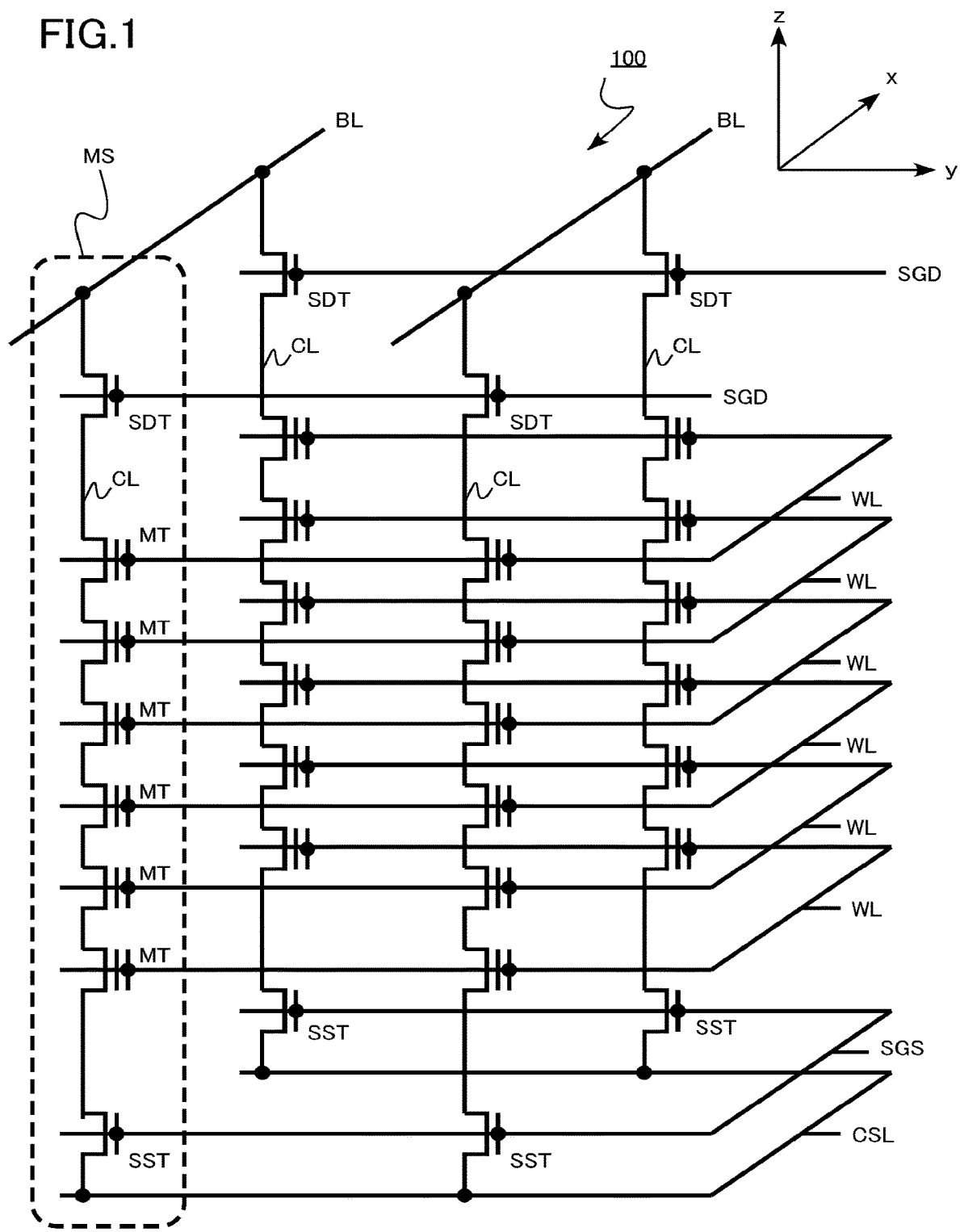
FIG. 1 is a circuit diagram of a memory cell array of a semiconductor memory device according to a first embodiment.

A semiconductor memory device of an embodiment is configured to include: a stacked body including gate electrode layers stacked in a first direction; a semiconductor layer provided in the stacked body and extending in the first direction; and a gate insulating layer provided between the semiconductor layer and at least one of the gate electrode layers, and the gate insulating layer including a first region containing a first oxide including at least one of a hafnium oxide and a zirconium oxide, in which a first length of the at least one of the gate electrode layers in the first direction is larger than a second length of the first region in the first direction.

Hereinafter, embodiments will be described with reference to the drawings. In addition, in the following description, the same or similar members and the like are denoted by the same reference numerals, and the description of the members and the like once described is appropriately omitted.

In the present specification, for the convenience, the terms "upper" and "lower" may be used. The terms "upper" and "lower" are terms merely indicating a relative positional relationship in the drawing and are not terms defining a positional relationship with respect to gravity.

The qualitative analysis and the quantitative analysis of the chemical composition of members constituting the semiconductor memory device in the present specification can be performed by, for example, secondary ion mass spectroscopy (SIMS) and energy dispersive X-ray spectroscopy (EDX). In addition, for example, a transmission electron microscope (TEM) can be used to measure the thicknesses of the members constituting the semiconductor memory device, the distance between the members, and the like. In addition, for example, nano beam diffraction (NBD) can be used for the identification of the crystal systems of the members constituting the semiconductor memory device.

First Embodiment

A semiconductor memory device according to a first embodiment is configured to include: a stacked body including gate electrode layers stacked in a first direction; a semiconductor layer provided in the stacked body and extending in the first direction; and a gate insulating layer provided between the semiconductor layer and at least one of the gate electrode layers, and the gate insulating layer including a first region containing a first oxide including at least one of a hafnium oxide and a zirconium oxide. A first length of the at least one of the gate electrode layers in the first direction is larger than a second length of the first region in the first direction.

The semiconductor memory device according to the first embodiment is a three-dimensional NAND flash memory having MFS-structured memory cells.

FIG. 1 is a circuit diagram of a memory cell array of the semiconductor memory device according to the first embodiment.

As illustrated in FIG. 1, the memory cell array 100 of the three-dimensional NAND flash memory according to the first embodiment is configured to include: a plurality of word lines WL (gate electrode layers); a common source line CSL; a source select gate line SGS; a plurality of channel layers CL (semiconductor layers); a plurality of drain select gate lines SGD; a plurality of bit lines BL; and a plurality of memory strings MS.

The plurality of word lines WL are stacked in a z direction (first direction). The plurality of channel layers CL extend in the z direction. The plurality of bit lines BL extend in an x direction.

As illustrated in FIG. 1, the memory string MS is configured to include: a source selection transistor SST; a plurality of memory cell transistors MT; and a drain selection transistor SDT which are connected in series between a common source line CSL and a bit line BL. One memory string MS can be selected by the bit line BL and the drain select gate line SGD, and one memory cell transistor MT can be selected by the word line WL.

Figure 2A:
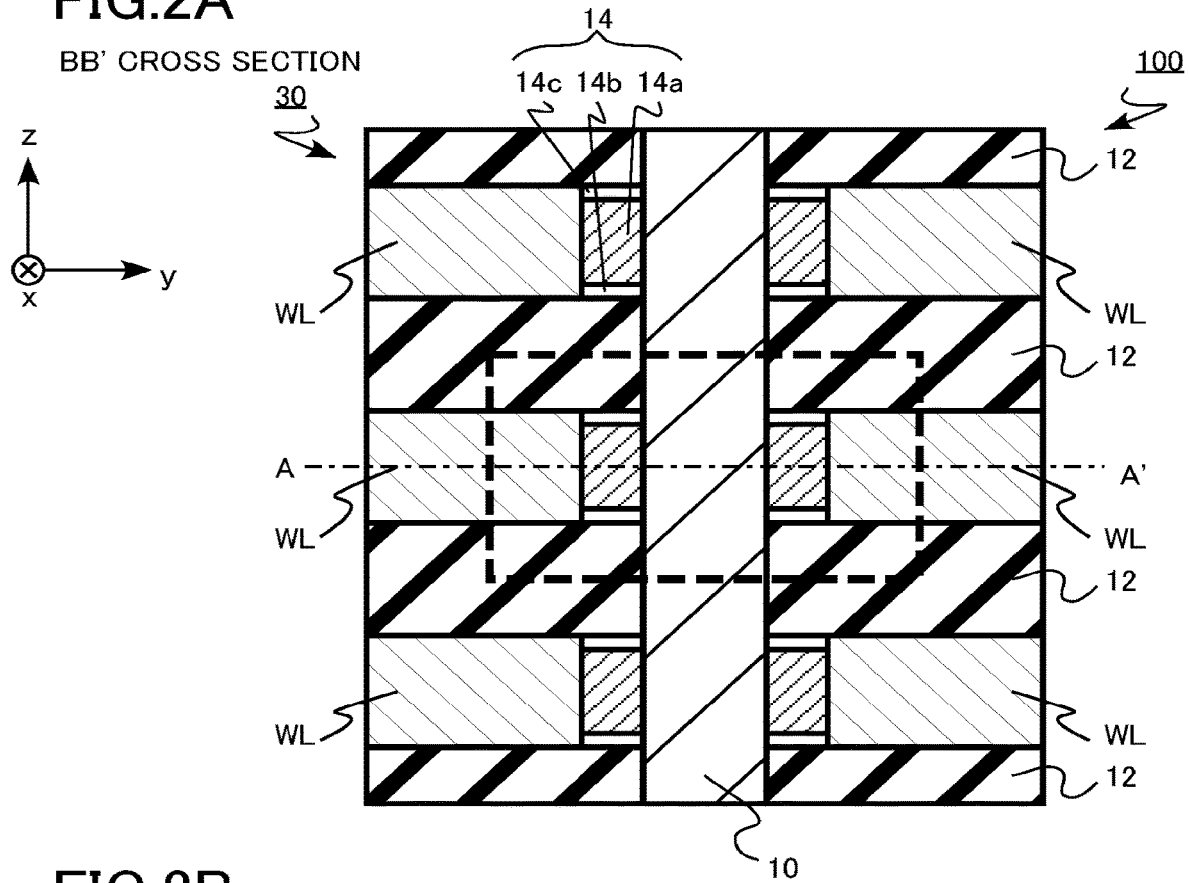
FIGS. 2A and 2B are schematic cross-sectional views of the memory cell array of the semiconductor memory device according to the first embodiment.
Figure 2B:
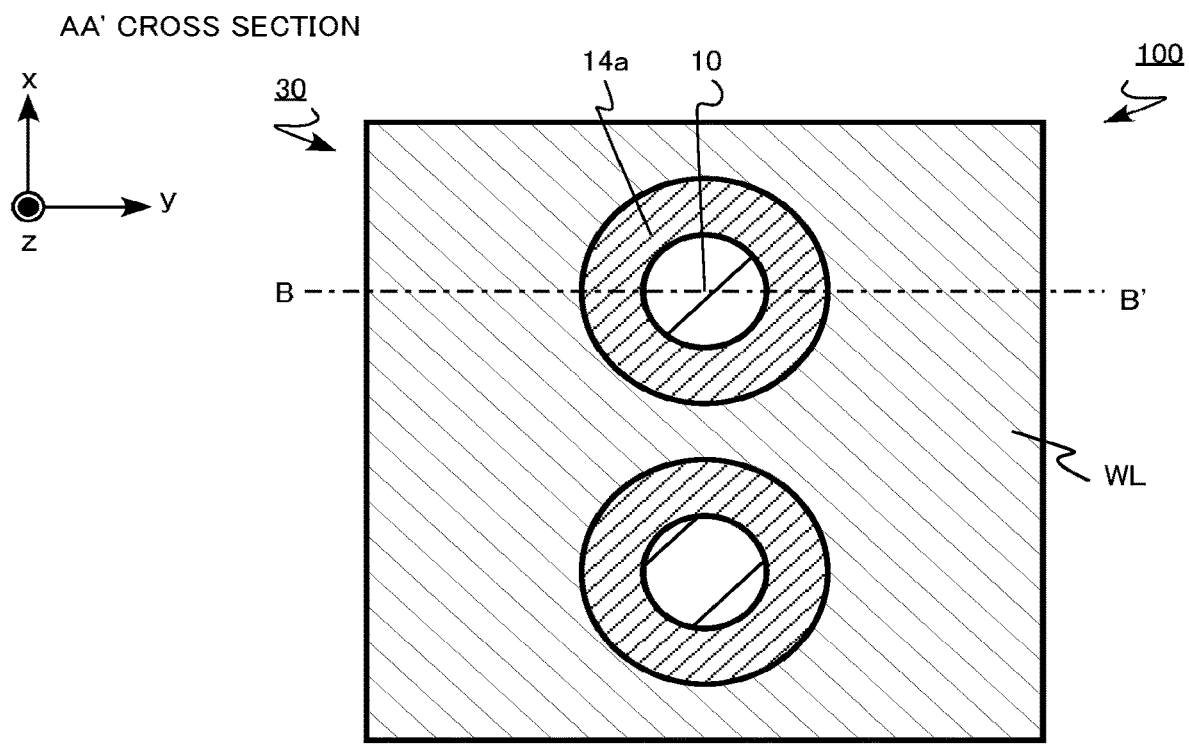

FIGS. 2A and 2B are schematic cross-sectional views of the memory cell array of the semiconductor memory device according to the first embodiment. FIGS. 2A and 2B illustrate cross sections of a plurality of memory cells in one memory string MS surrounded by, for example, a dotted line in the memory cell array 100 of FIG. 1.

FIG. 2A is a yz cross-sectional view of the memory cell array 100. FIG. 2A is a BB' cross section of FIG. 2B. FIG. 2B is an xy cross-sectional view of the memory cell array 100. FIG. 2B is an AA' cross section of FIG. 2A. In FIG. 2A, a region surrounded by a broken line is one memory cell.

Figure 3:
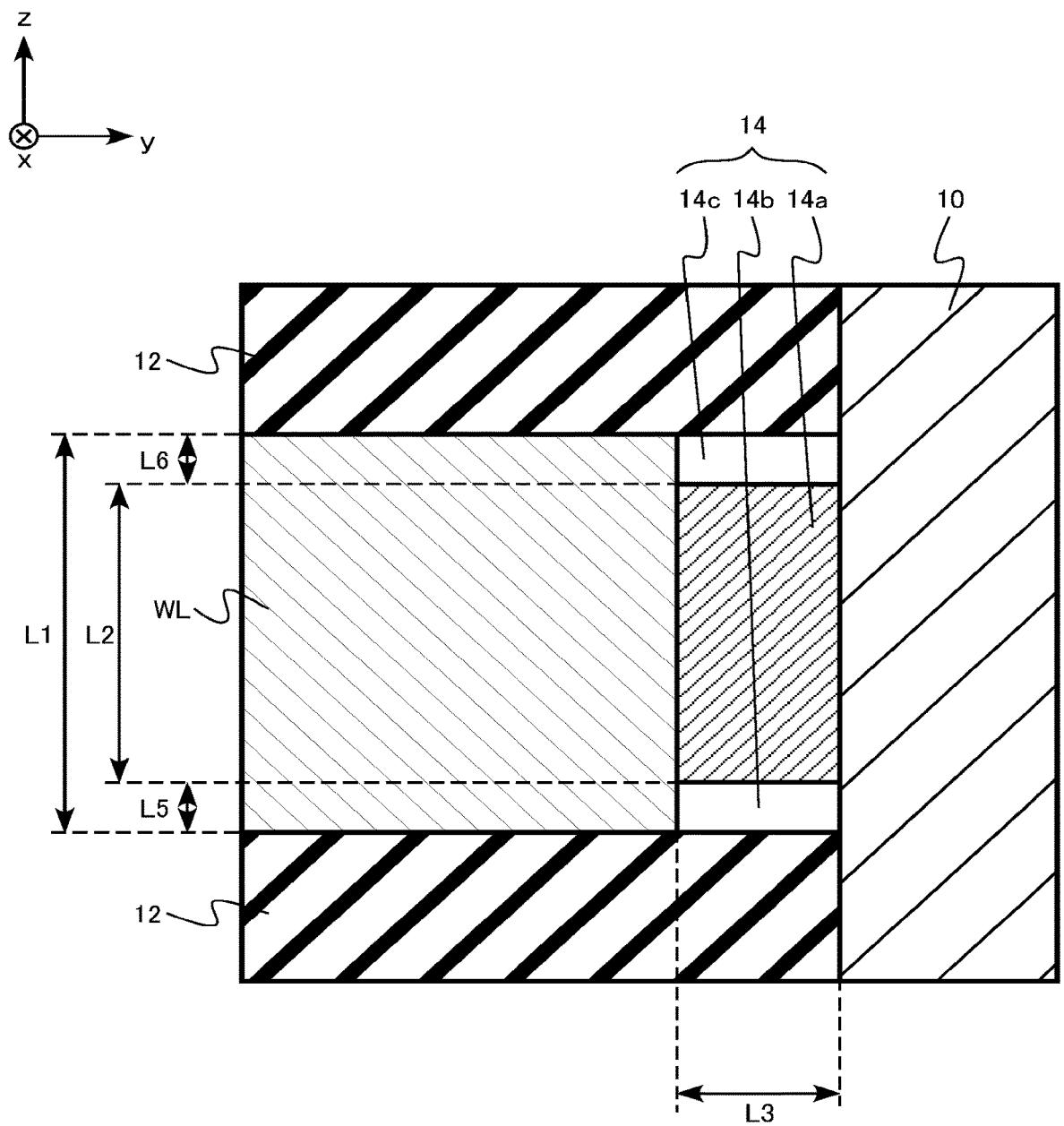
FIG. 3 is a schematic cross-sectional view of a memory cell of the semiconductor memory device according to the first embodiment.

FIG. 3 is a schematic cross-sectional view of the memory cell of the semiconductor memory device according to the first embodiment. FIG. 3 is an enlarged cross-sectional view of a portion of the memory cell.

As illustrated in FIGS. 2A and 2B, the memory cell array 100 is configured to include: a plurality of word lines WL (gate electrode layers); a semiconductor layer 10; a plurality of interlayer insulating layers 12 (insulating layers); and a gate insulating layer 14. The plurality of word lines WL and the plurality of interlayer insulating layers 12 constitute a stacked body 30. The gate insulating layer 14 has a ferroelectric region 14a (first region); a first paraelectric region 14b (second region); and a second paraelectric region 14c (third region).

As illustrated in FIG. 3, the memory cell is configured to include: a word line WL (gate electrode layer); a semiconductor layer 10; an interlayer insulating layer 12; and a gate insulating layer 14. The gate insulating layer 14 has a ferroelectric region 14a (first region); a first paraelectric region 14b (second region); and a second paraelectric region 14c (third region).

The word lines WL and the interlayer insulating layer 12 are provided, for example, on a semiconductor substrate (not illustrated).

The word lines WL and the interlayer insulating layers 12 are alternately stacked on the semiconductor substrate in the z direction (first direction). The word lines WL are arranged apart from each other in the z direction. The plurality of word lines WL and the plurality of interlayer insulating layers 12 constitute a stacked body 30.

The word line WL is a plate-shaped conductor. The word line WL is made of, for example, a metal, a metal nitride, a metal carbide, or a semiconductor. The word line WL is made of, for example, tungsten (W). The word line WL functions as a control electrode of the memory cell transistor MT. The word line WL is an example of a gate electrode layer.

The first length L1 of the word line WL in the first direction (z direction) is, for example, 5 nm or more and 40 nm or less.

The interlayer insulating layer 12 separates the word lines WL from each other. The interlayer insulating layer 12 is made of, for example, an oxide, an oxynitride, or a nitride. The interlayer insulating layer 12 is made of, for example, a silicon oxide.

The length of the interlayer insulating layer 12 in the first direction (z direction) is, for example, 5 nm or more and 40 nm or less.

The semiconductor layer 10 is provided in the stacked body 30. The semiconductor layer 10 extends in the z direction. The semiconductor layer 10 is provided to penetrate the stacked body 30. The semiconductor layer 10 has, for example, a columnar shape.

The semiconductor layer 10 is made of, for example, a polycrystalline semiconductor. The semiconductor layer 10 is made of, for example, polycrystalline silicon. The semiconductor layer 10 functions as a channel of the memory cell transistor MT.

The gate insulating layer 14 is provided between the semiconductor layer 10 and the word line WL. The gate insulating layer 14 is divided, for example, between adjacent memory cell transistors MT. The gate insulating layer 14 and the semiconductor layer 10 may be in direct contact with the gate insulating layer 14 and the word line WL. An interface layer which is not drawn may exist between the gate insulating layer 14 and the semiconductor layer 10. The interface layer may include silicon oxide.

The gate insulating layer 14 has a ferroelectric region 14a (first region), a first paraelectric region 14b (second region), and a second paraelectric region 14c (third region). The ferroelectric region 14a is provided between the first paraelectric region 14b and the second paraelectric region 14c.

The ferroelectric region 14a faces the first paraelectric region 14b in the z direction. The ferroelectric region 14a faces the second paraelectric region 14c in the z direction. The z direction includes not only the direction of arrows in FIG. 1,2,3 but also the direction opposite to the direction of the arrows.

The ferroelectric region 14a contains a ferroelectric material. The ferroelectric region 14a contains a first oxide containing at least one of the hafnium oxide and the zirconium oxide. The first oxide is a ferroelectric material. The first oxide mainly has an orthorhombic crystal. The first oxide contains a crystal of an orthorhombic crystal system. A main crystal structure of the first oxide is orthorhombic.

The ferroelectric region 14a contains a first oxide as a main component. The phrase "contains the first oxide as a main component" denotes that the molar ratio of the first oxide is the highest among the materials contained in the ferroelectric region 14a. The molar ratio of the first oxide is, for example, 90% or more.

The first oxide is, for example, a hafnium oxide of a ferroelectric material. The ferroelectric region 14a contains, for example, a hafnium oxide as a main component. The phrase "contains the hafnium oxide as a main component" denotes that the molar ratio of hafnium oxide is the highest among the materials contained in the ferroelectric region 14a. The molar ratio of the hafnium oxide is, for example, 90% or more.

The first oxide is, for example, a zirconium oxide of a ferroelectric material. The ferroelectric region 14a contains, for example, a zirconium oxide as a main component. The phrase "contains the zirconium oxide as a main component" denotes that the molar ratio of zirconium oxide is the highest among the materials contained in the ferroelectric region 14a.

The molar ratio of the zirconium oxide contained in the ferroelectric region 14a is, for example, 40% or more and 60% or less. The first oxide is, for example, a mixed crystal of a hafnium oxide of a ferroelectric material and a zirconium oxide of a ferroelectric material.

The first oxide contains, for example, at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba). In a case where the first oxide is a hafnium oxide, the containing of the above-mentioned additive element allows the hafnium oxide to easily exhibit ferroelectricity.

The first oxide includes an orthorhombic crystal. The first oxide is, for example, a hafnium oxide mainly made of an orthorhombic hafnium oxide. The hafnium oxide is, for example, a hafnium oxide mainly made of a third orthorhombic crystal system (Orthorhombic III, space group $Pbc2_1$, space group number 29).

The first oxide is, for example, a zirconium oxide mainly made of a zirconium oxide having an orthorhombic crystal system. The zirconium oxide is, for example, a zirconium oxide mainly having a third orthorhombic crystal system (Orthorhombic III, space group $Pbc2_1$, space group number 29).

The first paraelectric region 14b and the second paraelectric region 14c contain a paraelectric material. The material of the first paraelectric region 14b and the material of the second paraelectric region 14c are the same. The phrase "material are the same" means that the chemical compositions and the crystal structures of the material are the same. The phrase "material are the same" means that the chemical compositions and the crystal structures are the same within the range of variation occurring unavoidably in manufacturing.

The first paraelectric region 14b and the second paraelectric region 14c are made of a material different from that of the ferroelectric region 14a. The phrase "material different" denotes that the chemical compositions or the crystal structures are different. The phrase "material different" denotes that the chemical compositions or the crystal structures are different beyond the range of variation occurring unavoidably in manufacturing.

The first paraelectric region 14b and the second paraelectric region 14c contain a second oxide. The second oxide is a paraelectric material.

The second oxide contains, for example, at least one of the hafnium oxide and the zirconium oxide. The second oxide mainly has, for example, a crystal other than the orthorhombic crystal. A main crystal structure of the second oxide is a crystal structure other than the orthorhombic. The second oxide contains, for example, a crystal other than the orthorhombic crystal system. The second oxide mainly has, for example, a monoclinic crystal.

The first paraelectric region 14b and the second paraelectric region 14c contain the second oxide as a main component. The phrase "contain the second oxide as a main component" denotes that the molar ratio of the second oxide is the highest among the materials contained in the first paraelectric region 14b and the second paraelectric region 14c. The molar ratio of the second oxide is, for example, 90% or more.

The second oxide is made of, for example, a hafnium oxide of a paraelectric material. The first paraelectric region 14b and the second paraelectric region 14c contain, for example, the hafnium oxide as a main component. The phrase "contain the hafnium oxide as a main component" denotes that the molar ratio of the hafnium oxide is the highest among the materials contained in the first paraelectric region 14b and the second paraelectric region 14c. The molar ratio of the hafnium oxide is, for example, 90% or more.

The second oxide is made of, for example, a zirconium oxide of a paraelectric material. The first paraelectric region 14b and the second paraelectric region 14c contain, for example, the zirconium oxide as a main component. The phrase "contain the zirconium oxide as a main component" denotes that the molar ratio of the zirconium oxide is the highest among the materials contained in the first paraelectric region 14b and the second paraelectric region 14c.

The second oxide is, for example, an aluminum oxide or a silicon oxide.

The second oxide contains or does not contain, for example, at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba).

The first concentration of the additive element in the first oxide is different from, for example, the second concentration of the additive element in the second oxide. The first concentration of the additive element in the first oxide is higher than, for example, the second concentration of the additive element in the second oxide. The concentration of the additive element in the ferroelectric region 14a is different from, for example, the concentration of the additive element in the first paraelectric region 14b and the second paraelectric region 14c. The concentration of the additive element in the ferroelectric region 14a is higher than, for example, the concentration of the additive element in the first paraelectric region 14b and the second paraelectric region 14c.

The second oxide contains a crystal other than the orthorhombic crystal system. The second oxide is, for example, a hafnium oxide mainly made of a hafnium oxide other than the orthorhombic crystal system. The hafnium oxide is, for example, a hafnium oxide mainly having a monoclinic crystal system.

The second oxide is, for example, a zirconium oxide mainly made of a zirconium oxide other than the orthorhombic crystal system. The zirconium oxide is, for example, a zirconium oxide mainly having a monoclinic crystal system.

The first length L1 of the word line WL in the first direction (z direction) is, for example, 5 nm or more and 40 nm or less. The second length L2 of the ferroelectric region 14a in the first direction (z direction) is, for example, 4 nm or more and 38 nm or less. The first length L1 is larger than the second length L2. The first length L1 is, for example, 1.1 times or more and twice or less the second length L2.

The third length L3 of the ferroelectric region 14a in the direction (y direction) from the word line WL toward the semiconductor layer 10 is, for example, 3 nm or more and 20 nm or less.

The fifth length L5 of the first paraelectric region 14b in the first direction (z direction) is, for example, 1 nm or more and 10 nm or less. The sixth length L6 of the second paraelectric region 14c in the first direction (z direction) is, for example, 1 nm or more and 10 nm or less.

The length of the first paraelectric region 14b and the second paraelectric region 14c in the direction (y direction) from the word line WL toward the semiconductor layer 10 is, for example, 3 nm or more and 20 nm or less.

In the memory cell according to the first embodiment, the polarization inversion state of the ferroelectric material contained in the ferroelectric region 14a is controlled by a voltage applied between the word line WL and the semiconductor layer 10. According to the polarization inversion state of the ferroelectric region 14a, the threshold voltage of the memory cell transistor MT is changed. When the threshold voltage of the memory cell transistor MT is changed, the "on" current of the memory cell transistor MT is changed. For example, when the state where the threshold voltage is high and the "on" current is low is defined as data "0", and the state where the threshold voltage is low and the "on" current is high is defined as data "1", the memory cell can store 1-bit data of "0" and "1".

Next, an example of a method of manufacturing the semiconductor memory device according to the first embodiment will be described. FIGS. 4, 5, 6, 7, 8, 9, 10, 11, 12, 13, and 14 are schematic cross-sectional views illustrating the method of manufacturing the semiconductor memory device according to the first embodiment. FIGS. 4, 5, 6, 7, 8, 9, 10, 11, 12, 13, and 14 illustrate the respective cross sections corresponding to FIG. 2A. FIGS. 4, 5, 6, 7, 8, 9, 10, 11, 12, 13, and 14 illustrate an example of the method of manufacturing the memory cell array 100 of the semiconductor memory device.

Figure 4:
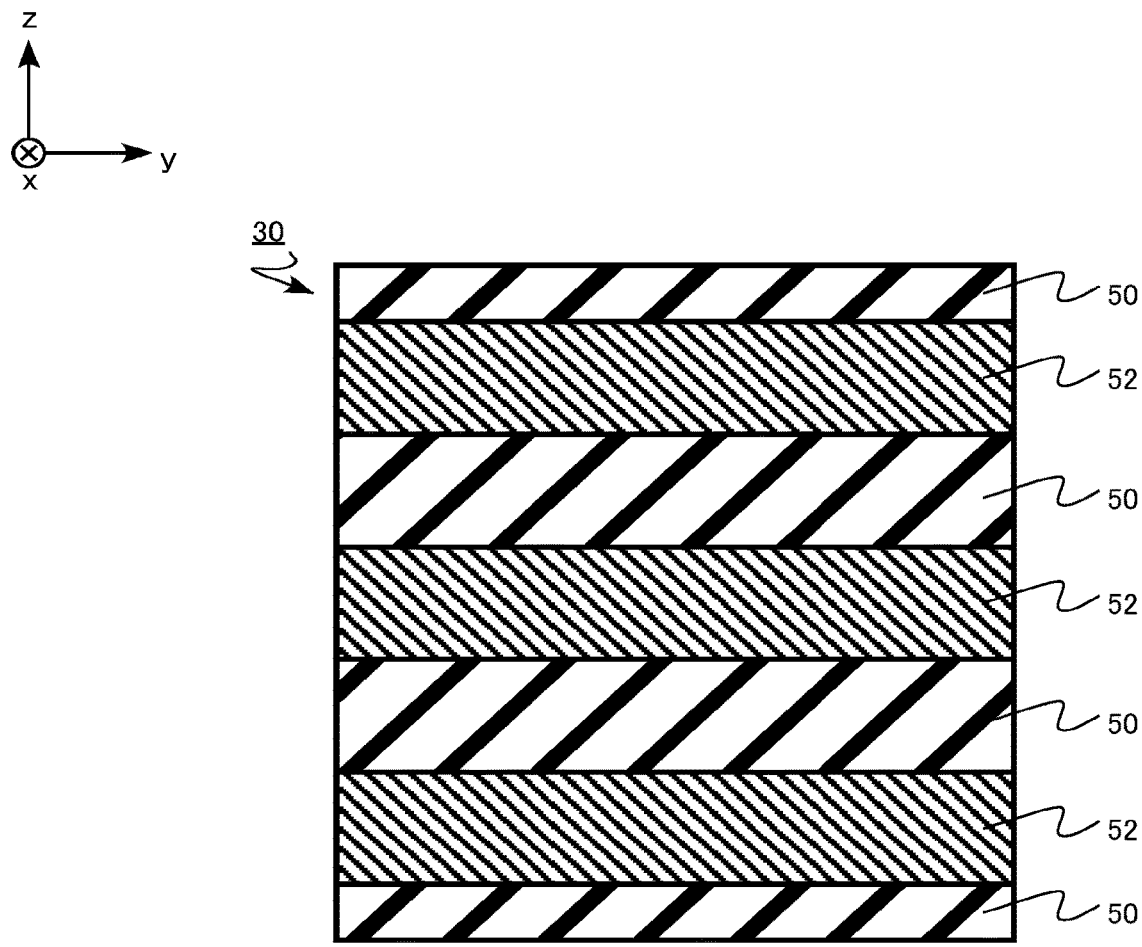
FIG. 4 is a schematic cross-sectional view illustrating a method of manufacturing the semiconductor memory device according to the first embodiment.

First, a silicon oxide layer 50 and a silicon nitride layer 52 are alternately stacked on the semiconductor substrate (not illustrated) (FIG. 4). The stacked body 30 is formed by the silicon oxide layer 50 and the silicon nitride layer 52. The silicon oxide layer 50 and the silicon nitride layer 52 are formed by, for example, a chemical vapor deposition method (CVD method). A portion of the silicon oxide layer 50 finally becomes the interlayer insulating layer 12.

Figure 5:
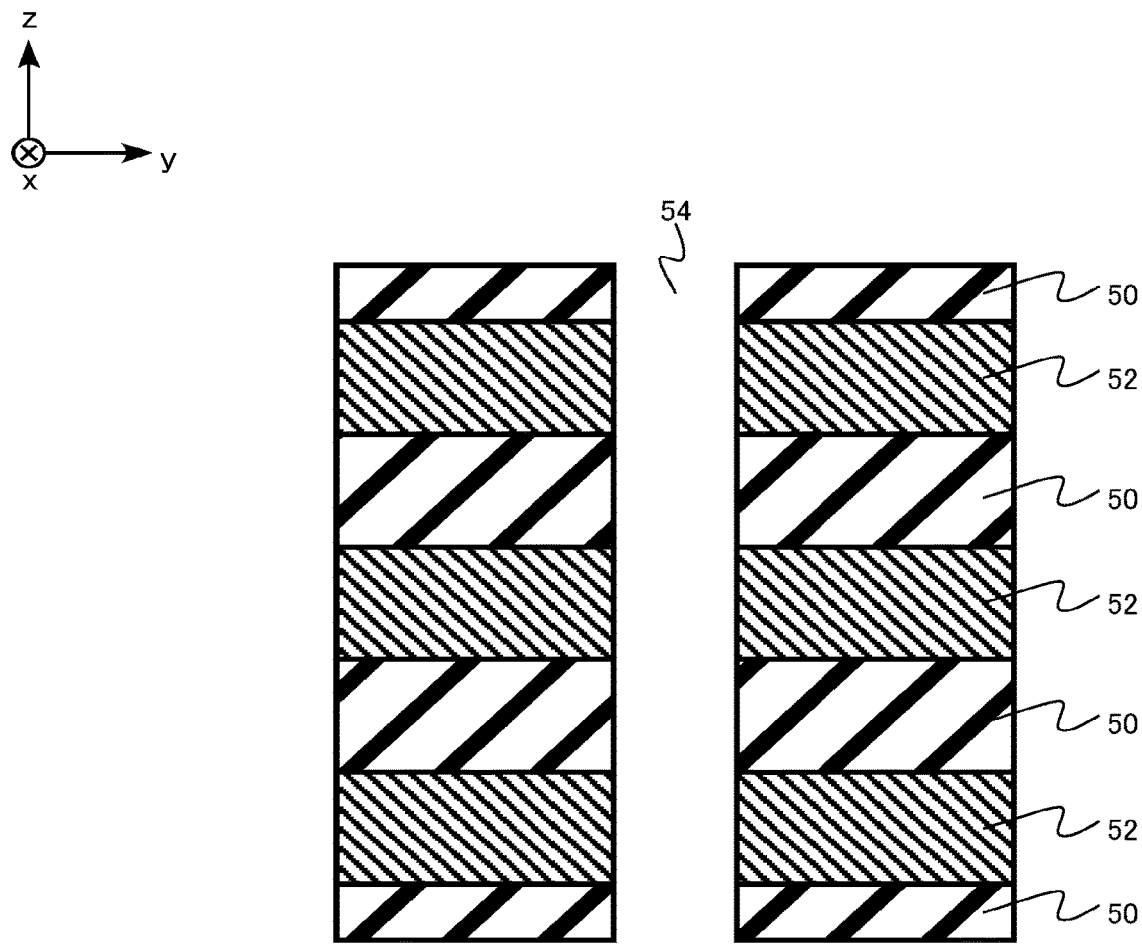
FIG. 5 is a schematic cross-sectional view illustrating the method of manufacturing the semiconductor memory device according to the first embodiment.

Next, an opening 54 is formed in the silicon oxide layer 50 and the silicon nitride layer 52 (FIG. 5). The opening 54 is formed by, for example, a lithography method and a reactive ion etching method (RIE method).

Figure 6:
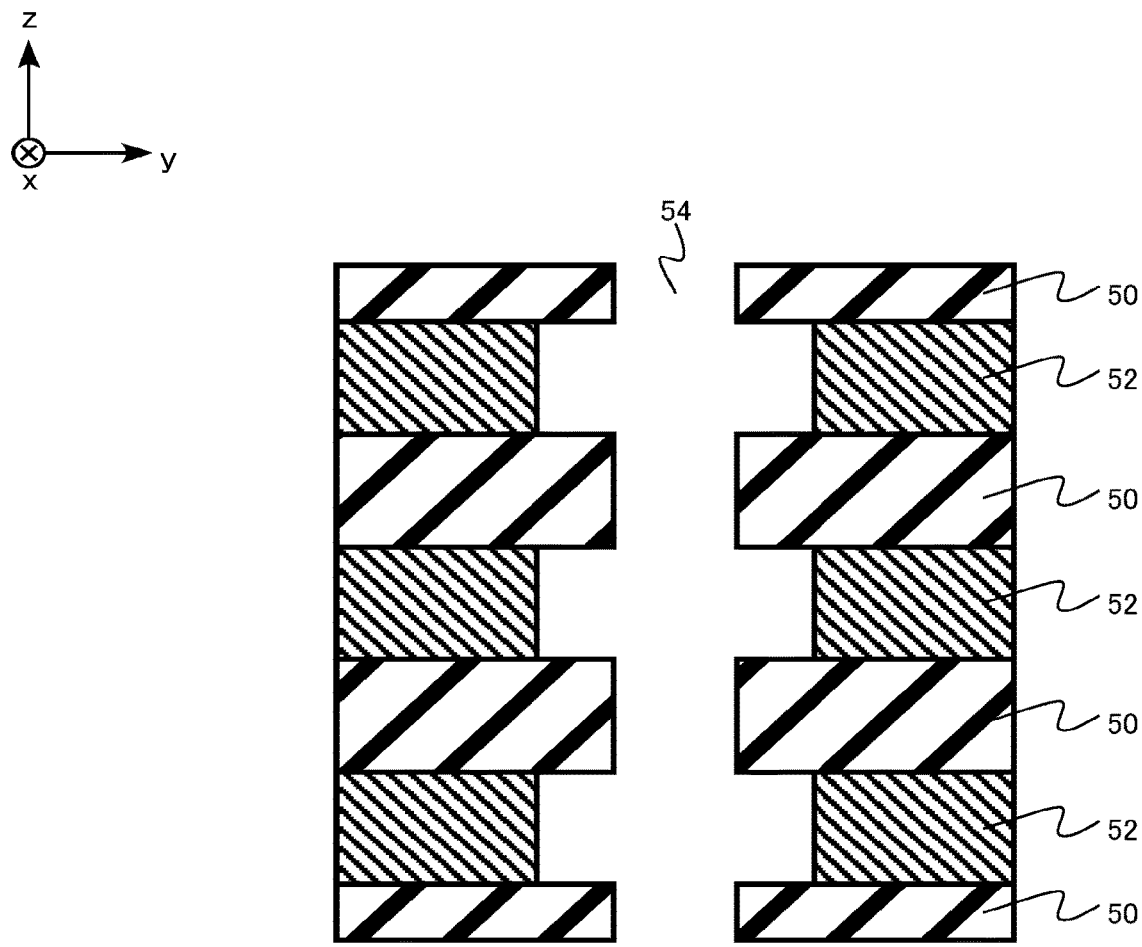
FIG. 6 is a schematic cross-sectional view illustrating the method of manufacturing the semiconductor memory device according to the first embodiment.

Next, the silicon nitride layer 52 exposed on the inner surface of the opening 54 is selectively receded by wet etching (FIG. 6). For the wet etching, for example, a phosphoric acid solution is used to selectively etch the silicon nitride layer 52 with respect to the silicon oxide layer 50.

Figure 7:
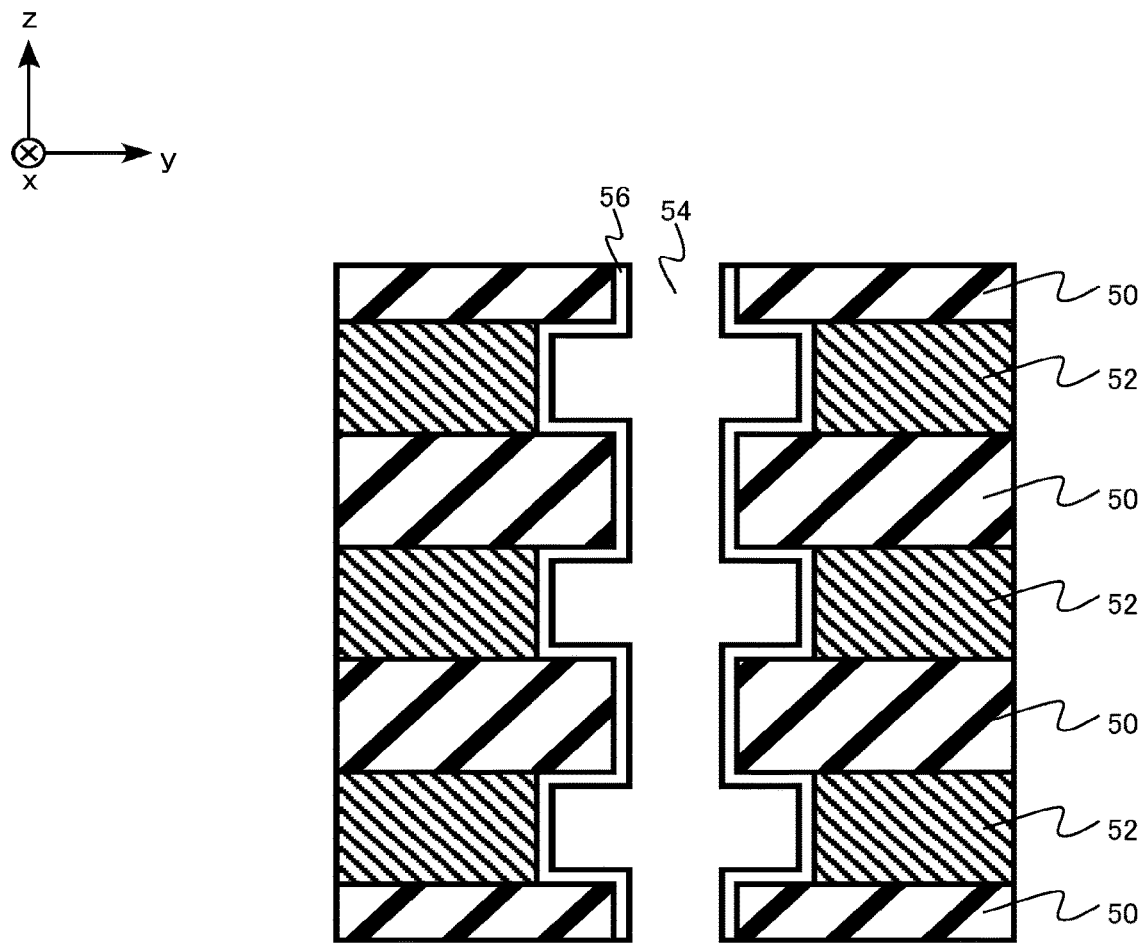
FIG. 7 is a schematic cross-sectional view illustrating the method of manufacturing the semiconductor memory device according to the first embodiment.

Next, a first hafnium oxide film 56 is formed in the opening 54 and in a region where the silicon nitride layer 52 has been receded (FIG. 7). The first hafnium oxide film 56 is formed by, for example, an atomic layer deposition method (ALD method). No additive element is added to the first hafnium oxide film 56. A portion of the first hafnium oxide film 56 finally becomes the first paraelectric region 14b and the second paraelectric region 14c of the gate insulating layer 14.

Figure 8:
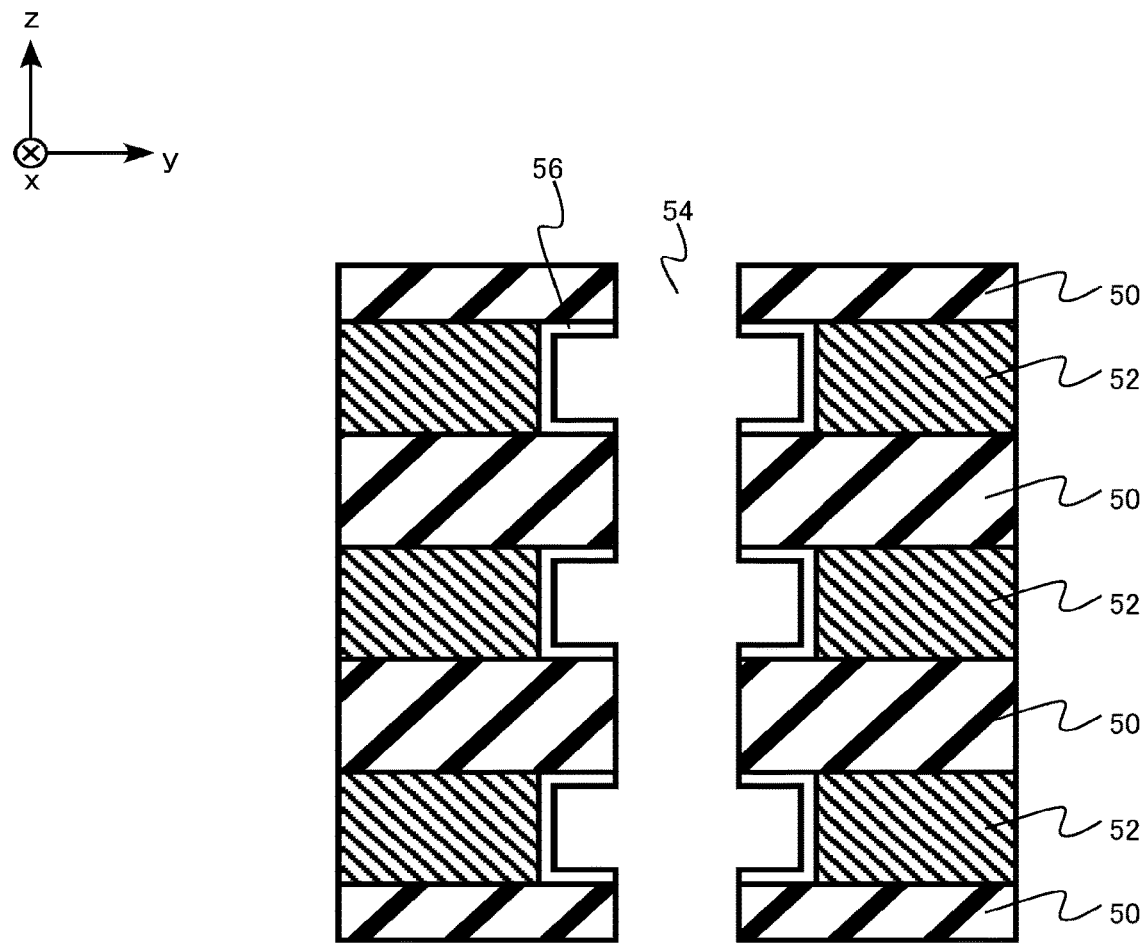
FIG. 8 is a schematic cross-sectional view illustrating the method of manufacturing the semiconductor memory device according to the first embodiment.

Next, the first hafnium oxide film 56 on the inner surface of the opening 54 is removed by etching (FIG. 8). The first hafnium oxide film 56 is removed by etching, for example, by RIE.

Figure 9:
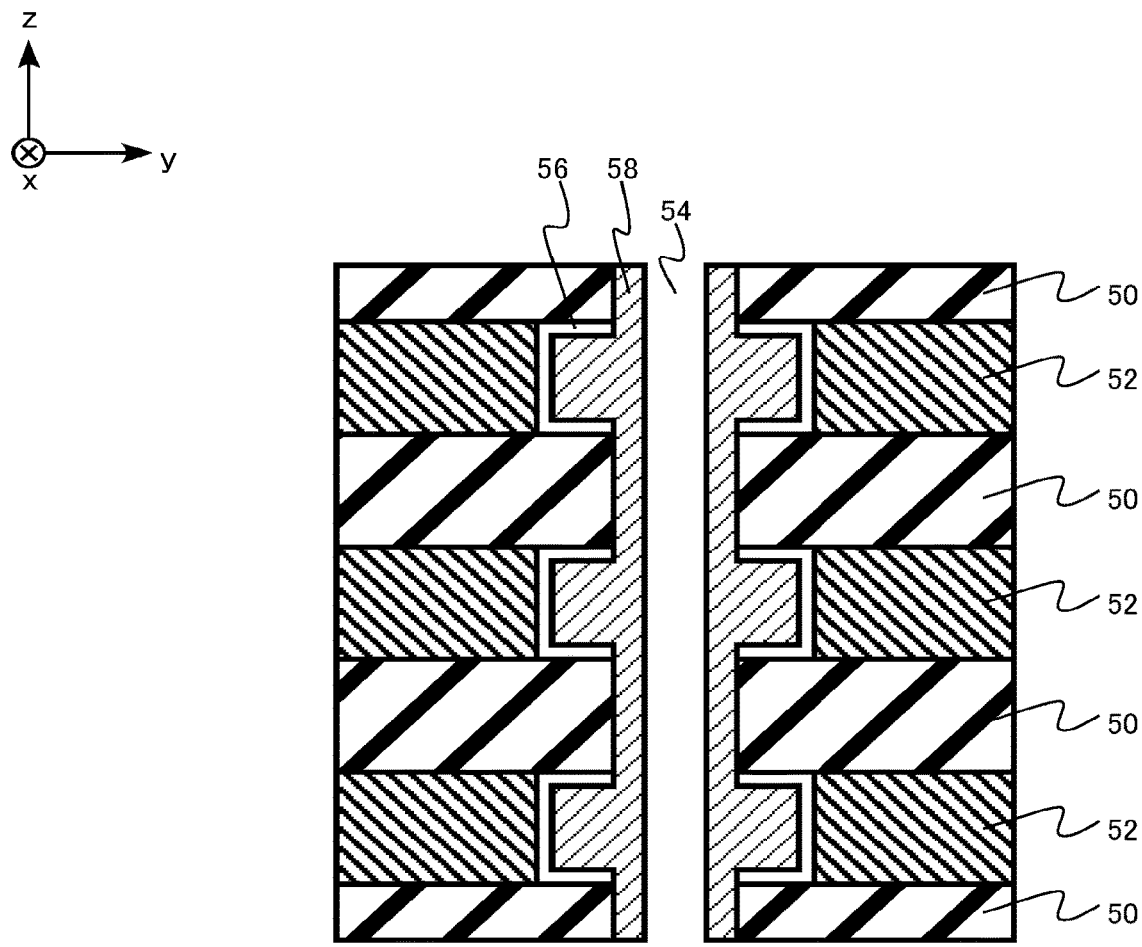
FIG. 9 is a schematic cross-sectional view illustrating the method of manufacturing the semiconductor memory device according to the first embodiment.

Next, a second hafnium oxide film 58 to which an additive element is added is formed in the opening 54 (FIG. 9). For example, silicon (Si) as an additive element is added to the second hafnium oxide film 58. The second hafnium oxide film 58 is formed by, for example, an ALD method. The second hafnium oxide film 58 finally becomes the ferroelectric region 14a.

Figure 10:
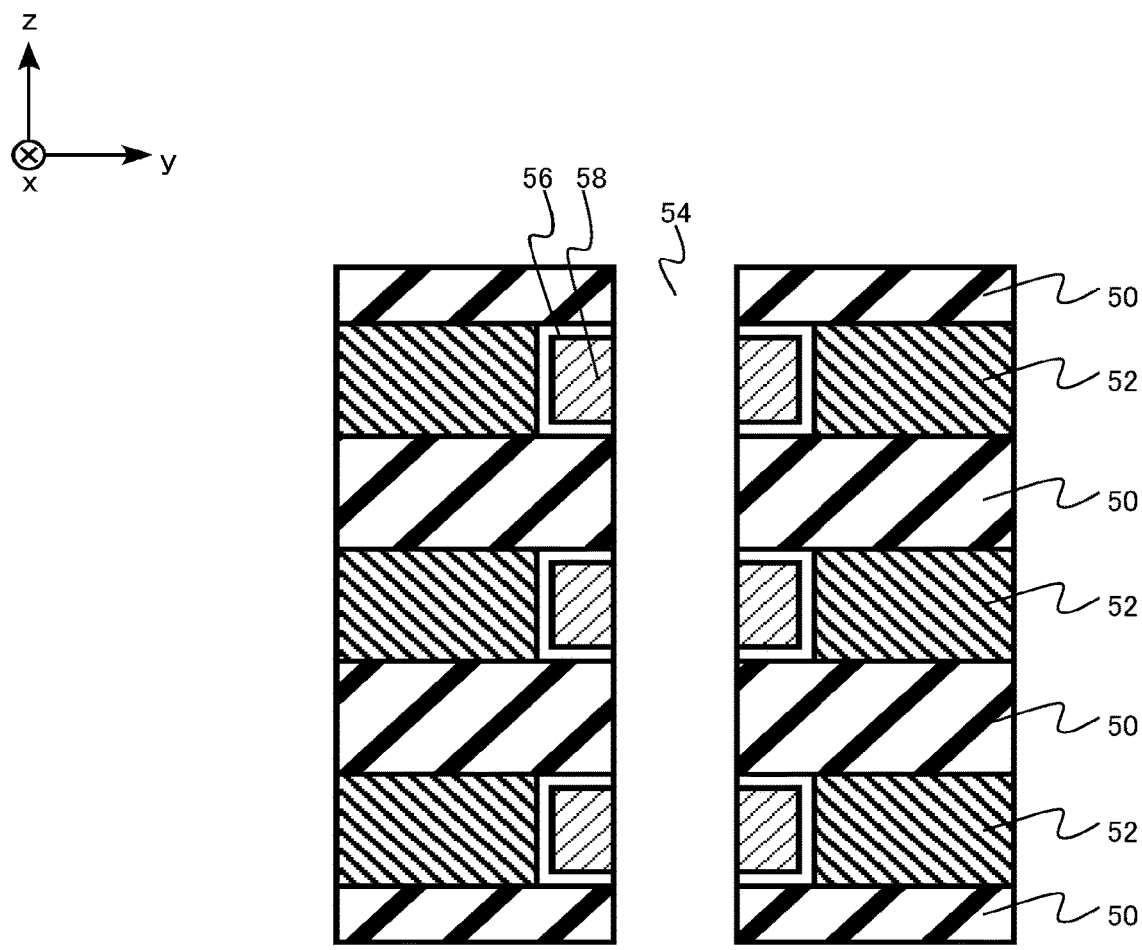
FIG. 10 is a schematic cross-sectional view illustrating the method of manufacturing the semiconductor memory device according to the first embodiment.

Next, the second hafnium oxide film 58 on the inner surface of the opening 54 is removed by etching (FIG. 10). The second hafnium oxide film 58 is removed by etching, for example, by RIE.

Figure 11:
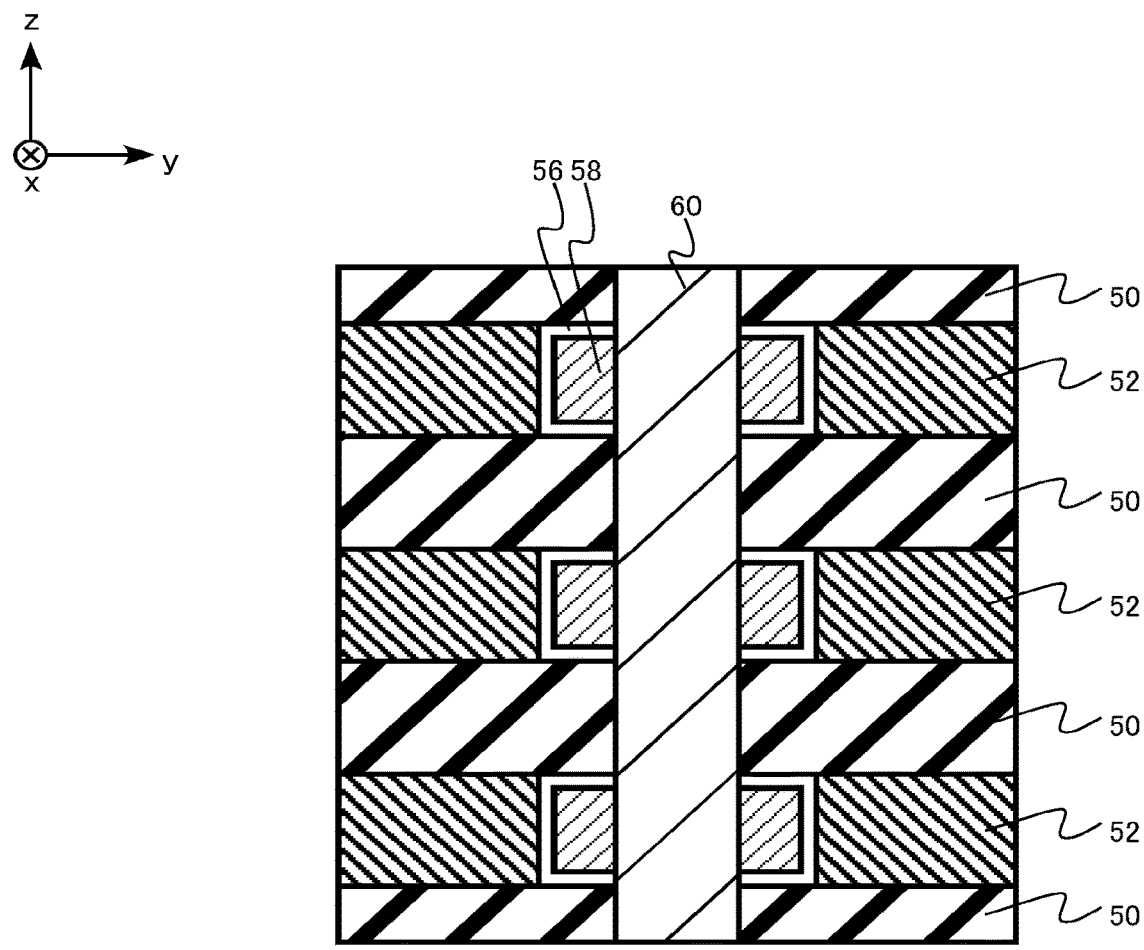
FIG. 11 is a schematic cross-sectional view illustrating the method of manufacturing the semiconductor memory device according to the first embodiment.

Next, a polycrystalline silicon film 60 is formed in the opening 54, and the opening 54 is buried (FIG. 11). The polycrystalline silicon film 60 is formed by, for example, a CVD method. The polycrystalline silicon film 60 finally becomes the semiconductor layer 10.

Figure 12:
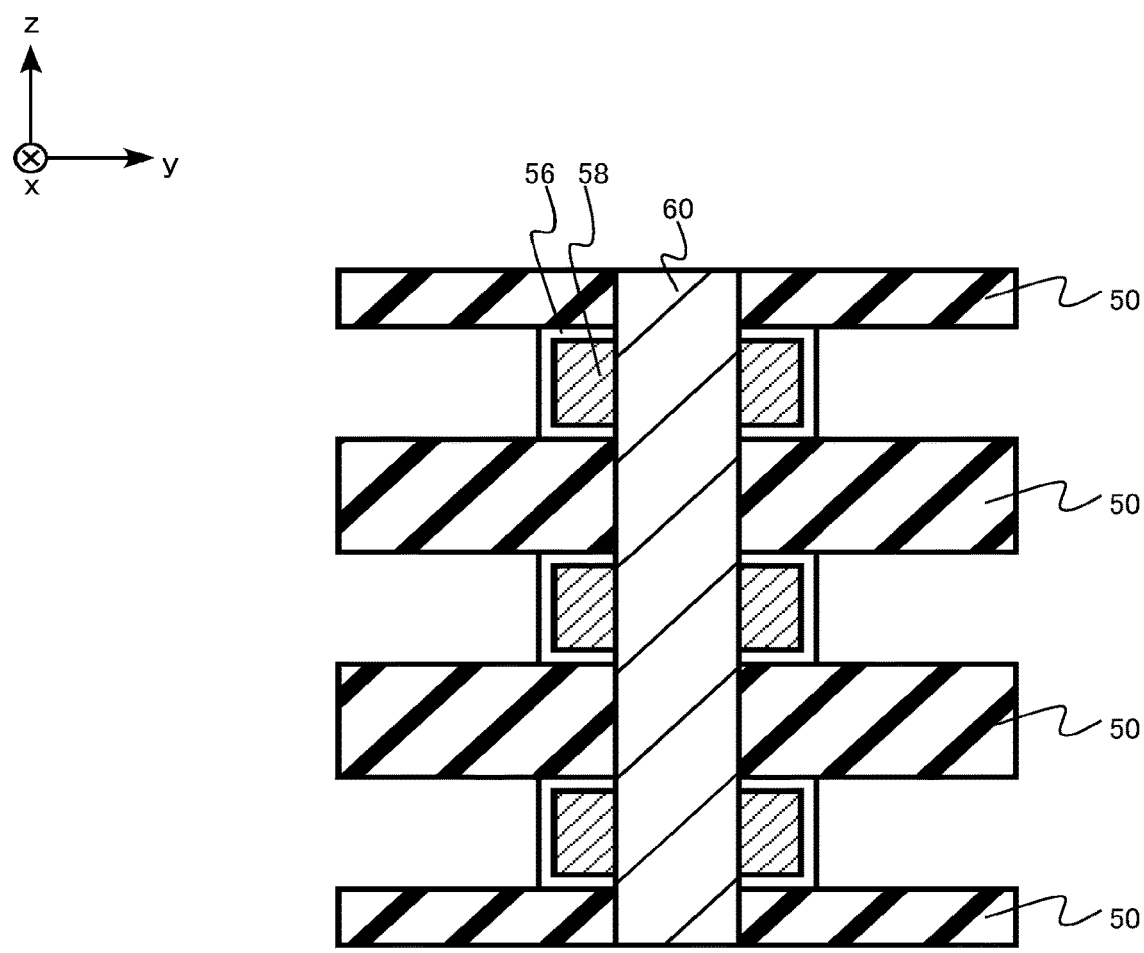
FIG. 12 is a schematic cross-sectional view illustrating the method of manufacturing the semiconductor memory device according to the first embodiment.

Next, the silicon nitride layer 52 is selectively removed by wet etching using an etching groove (not illustrated) (FIG. 12). For the wet etching, for example, a phosphoric acid solution is used to selectively etch the silicon nitride layer 52 with respect to the silicon oxide layer 50 and the first hafnium oxide film 56.

Figure 13:
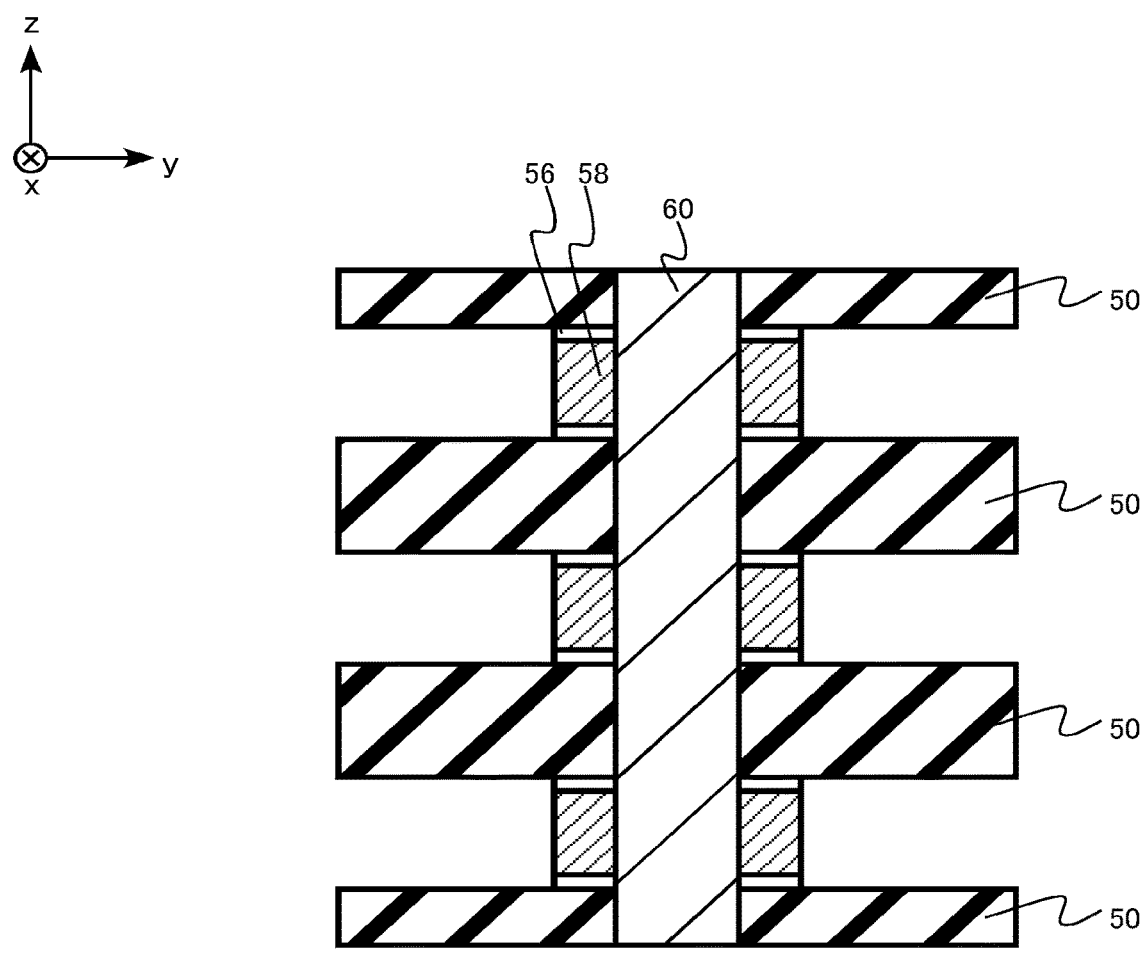
FIG. 13 is a schematic cross-sectional view illustrating the method of manufacturing the semiconductor memory device according to the first embodiment.

Next, the exposed first hafnium oxide film 56 is removed by etching by using an etching groove (not illustrated) (FIG. 13). The first hafnium oxide film 56 is removed by, for example, wet etching.

Figure 14:
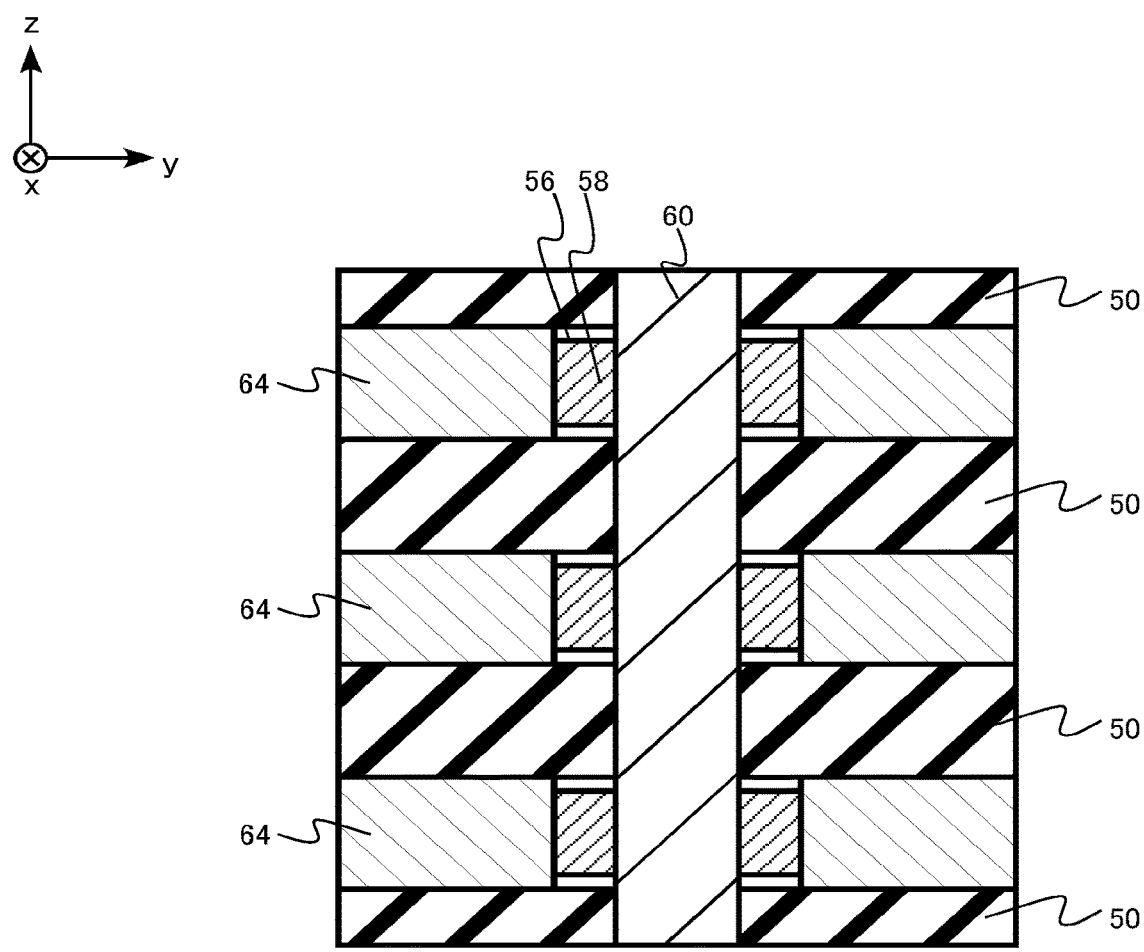
FIG. 14 is a schematic cross-sectional view illustrating the method of manufacturing the semiconductor memory device according to the first embodiment.

Next, a tungsten film 64 is formed on the second hafnium oxide film 58 (FIG. 14). The tungsten film 64 is formed by, for example, a CVD method. The tungsten film 64 finally becomes the word line WL.

After the formation of the tungsten film 64, crystallization annealing is performed. By the crystallization annealing, the second hafnium oxide film 58 becomes a ferroelectric material. This region becomes the ferroelectric region 14a. On the other hand, the first hafnium oxide film 56 becomes a paraelectric material. This region becomes the first paraelectric region 14b and the second paraelectric region 14c.

With the above-described manufacturing method, the semiconductor memory device according to the first embodiment is manufactured.

Next, the functions and the effects of the semiconductor memory device according to the first embodiment will be described.

In ferroelectric memory including memory cells having an MFS structure, there is a problem of the degradation of the memory cell characteristics due to the instability of polarization. For example, since the polarization is unstabilized, the threshold voltage of the memory cell transistor MT fluctuates, or the leak current of the memory cell transistor MT increases, and thus, the read disturb characteristic of the memory cell is degraded. Due to the degradation of the read disturb characteristic of the memory cell, the reliability of the ferroelectric memory is reduced.

Figure 15:
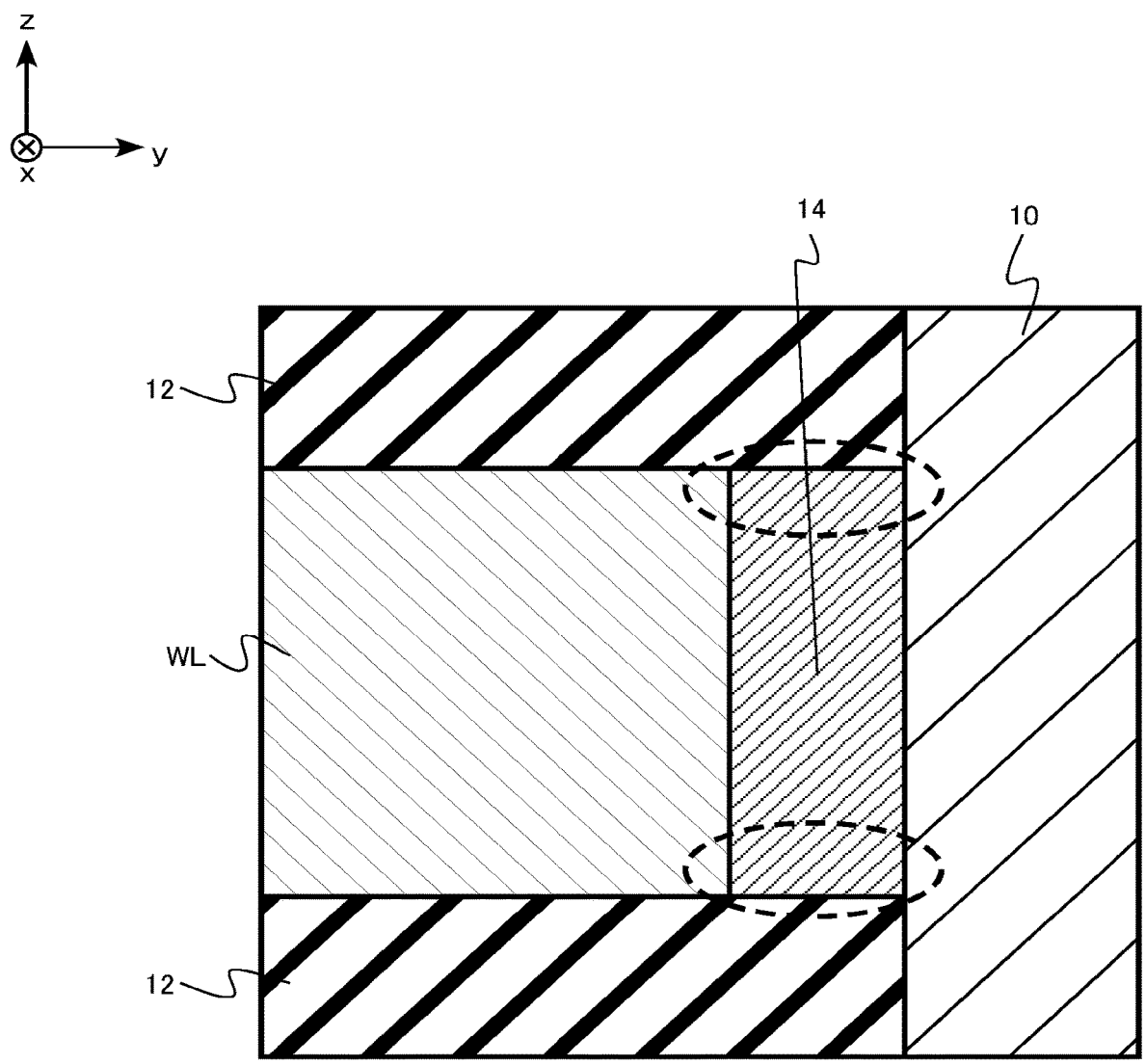
FIG. 15 is schematic cross-sectional views of a portion of a memory cell array of a semiconductor memory device according to Comparative Example.

FIG. 15 is a schematic cross-sectional view of a memory cell of a semiconductor memory device according to Comparative Example. FIG. 15 is an enlarged cross-sectional view of a portion of the memory cell. FIG. 15 is a view corresponding to FIG. 3 of the semiconductor memory device according to the first embodiment.

The memory cell of the semiconductor memory device according to Comparative Example is different from that of the first embodiment in that the length of the word line WL in the first direction (z direction) is equal to the length of the gate insulating layer 14 in the first direction (z direction). In other words, the semiconductor memory device according to Comparative Example is different from the semiconductor memory device according to the first embodiment in that the gate insulating layer 14 does not have the first paraelectric region 14b and the second paraelectric region 14c.

It is considered that one of the reasons why the threshold voltage of the memory cell transistor MT fluctuates or the leak current of the memory cell transistor MT increases is that the electric field is concentrated on the end (the region surrounded by the dotted line in FIG. 15) of the gate insulating layer 14 in the first direction (z direction). The electric field is concentrated on the end of the gate insulating layer 14 because the end of the gate insulating layer 14 is adjacent to the corner of the word line WL. Due to the concentration of the electric field on the end of the gate insulating layer 14, a strong stress is applied to the end of the gate insulating layer 14. For this reason, it is considered that the polarization is unstabilized.

Furthermore, it is considered that, at the end of the gate insulating layer 14, due to the application of stress according to lattice mismatch between the material of the gate insulating layer 14 and the material of the interlayer insulating layer 12, the segregation of an additive element in the gate insulating layer 14, or the like, the polarization is likely to be unstabilized as compared with the central portion of the gate insulating layer 14.

In the memory cell of the semiconductor memory device according to the first embodiment, the first length L1 of the word line WL in the first direction (z direction) is larger than the second length L2 of the ferroelectric region 14a in the first direction (z direction). In the memory cell of the semiconductor memory device according to the first embodiment, the first paraelectric region 14b and the second paraelectric region 14c are provided at the end of the gate insulating layer 14 in the first direction (z direction).

In the memory cell of the semiconductor memory device according to the first embodiment, the ferroelectric region 14a does not exist at the end of the gate insulating layer 14. Therefore, even if an electric field is concentrated on the end of the gate insulating layer 14, the polarization is not unstabilized, and thus, the degradation of the memory cell characteristics is suppressed. Therefore, the read disturb characteristic of the memory cell is improved, and the reliability of the ferroelectric memory is improved.

From the viewpoint of stabilizing the polarization of the end of the gate insulating layer 14, the first length L1 of the word line WL in the first direction (z direction) is, for example, preferably 1.1 times or more the second length L2 of the ferroelectric region 14a in the first direction (z direction), more preferably 1.2 times or more.

The material of the first oxide contained in the ferroelectric region 14a and the material of the second oxide contained in the first paraelectric region 14b and the second paraelectric region 14c are preferably materials having the same or similar crystal structures. Since the crystal structures of the material of the first oxide and the material of the second oxide are the same or similar, mismatch between the ferroelectric region 14a and the first paraelectric region 14b and mismatch between the ferroelectric region 14a and the second paraelectric region 14c are suppressed. Therefore, the second oxide preferably contains at least one of the hafnium oxide and the zirconium oxide.

From the viewpoint of improving the ferroelectricity of the ferroelectric region 14a, the first oxide contained in the ferroelectric region 14a preferably contains at least one additive element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba).

From the viewpoint that the first paraelectric region 14b and the second paraelectric region 14c do not exhibit ferroelectricity, the first concentration of the additive element of the first oxide is preferably different from the second concentration of the additive element of the second oxide.

Since the first concentration of the additive element is within a predetermined range, the first oxide is likely to exhibit ferroelectricity. When the first concentration of the additive element is out of the predetermined range, it is difficult for the first oxide to exhibit ferroelectricity.

Therefore, since the second concentration is set to be a concentration different from the first concentration which is out of a predetermined range, the first oxide can be allowed to exhibit ferroelectricity, and the second oxide can be allowed not to exhibit ferroelectricity.

For example, in a case where the first oxide is a hafnium oxide, from the viewpoint of exhibiting ferroelectricity, the first concentration is preferably 0.1 atomic % or more and 60% or less. A suitable range of the first concentration for allowing the hafnium oxide to exhibit ferroelectricity differs depending on the type of the additive element. For example, when the additive element is silicon (Si), a suitable range of the first concentration for exhibiting ferroelectricity is 3 atomic % or more and 7 atomic % or less. For example, in a case where the additive element is barium (Ba), a suitable range of the first concentration for exhibiting ferroelectricity is 0.1 atomic % or more and 3 atomic % or less. For example, in a case where the additive element is zirconium (Zr), a suitable range of the first concentration for exhibiting ferroelectricity is 10 atomic % or more and 60 atomic % or less.

For example, since the second concentration is set to be a concentration deviating from a predetermined range to a lower side and the first concentration is set to be a concentration that is higher than the second concentration within the predetermined range, the first oxide can be allowed to exhibit ferroelectricity, and the second oxide can be allowed not to exhibit ferroelectricity.

As described above, according to the semiconductor memory device according to the first embodiment, the polarization of the memory cell is stabilized, and the reliability can be improved.

Second Embodiment

A semiconductor memory device according to a second embodiment is different from the semiconductor memory device according to the first embodiment in that the gate insulating layer includes a fourth region provided between the at least one of the gate electrode layers and the first region, and the fourth region is made of the same material as that of the second region. Hereinafter, description of contents overlapping with those of the first embodiment will be omitted.

Figure 16A:
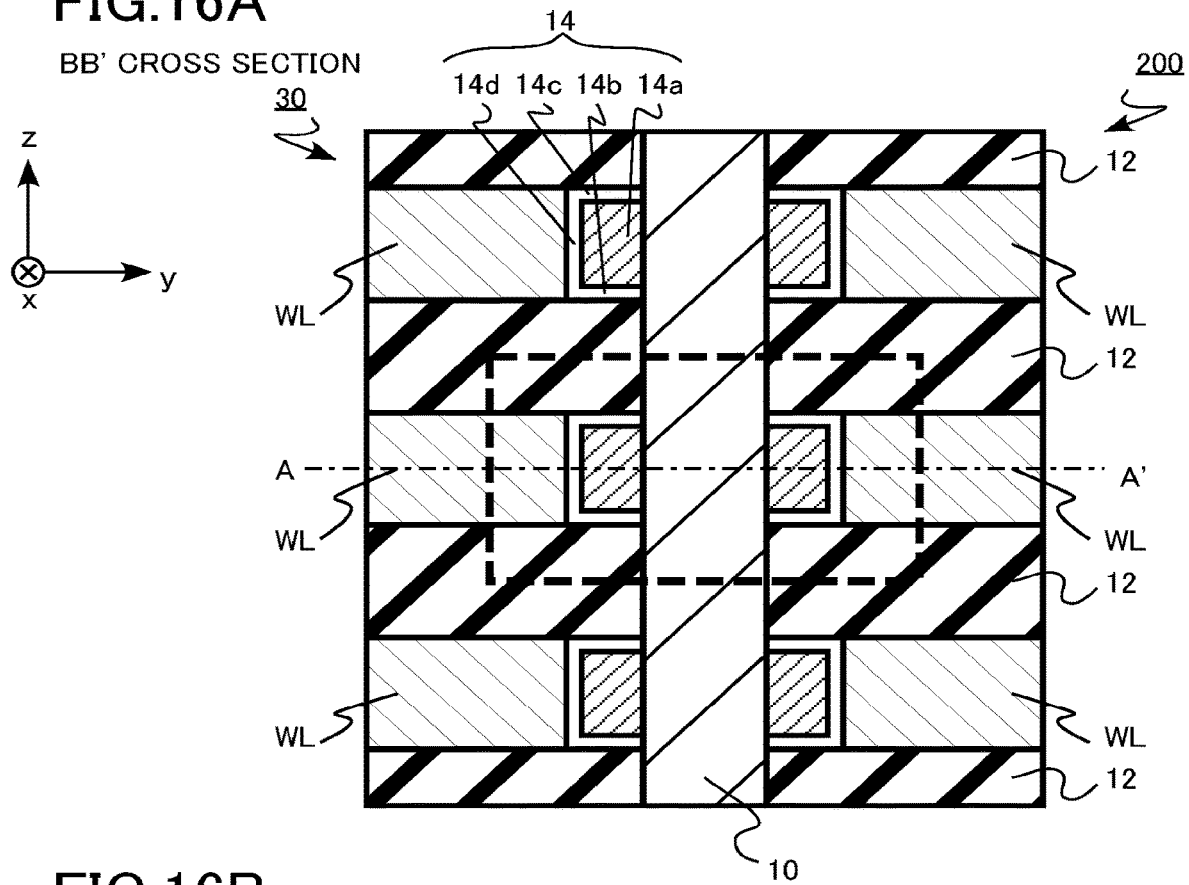
FIGS. 16A and 16B are schematic cross-sectional views of a memory cell array of a semiconductor memory device according to a second embodiment.
Figure 16B:
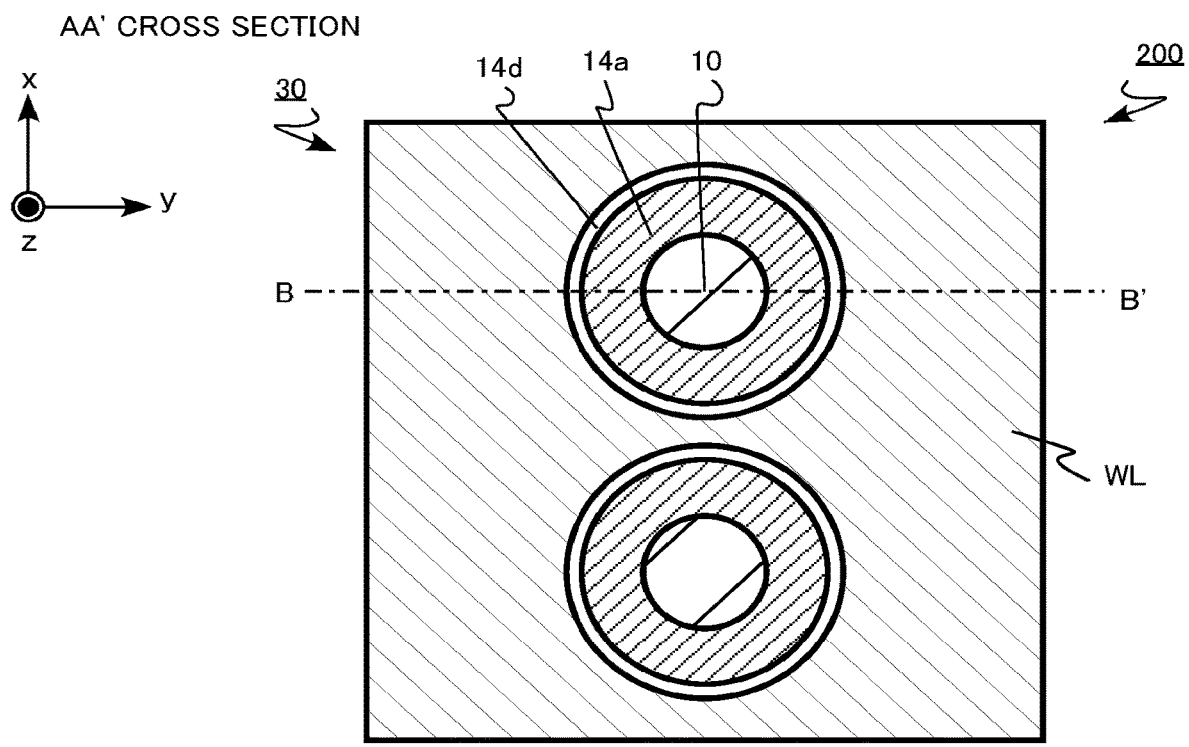

FIGS. 16A and 16B are schematic cross-sectional views of a memory cell array of the semiconductor memory device according to the second embodiment. FIGS. 16A and 16B are views corresponding to FIGS. 2A and 2B of the semiconductor memory device according to the first embodiment.

FIG. 16A is a yz cross-sectional view of the memory cell array 200. FIG. 16A is an BB' cross section of FIG. 16B. FIG. 16B is an xy cross-sectional view of the memory cell array 100. FIG. 16B is an AA' cross section of FIG. 16A. In FIG. 16A, a region surrounded by a broken line is one memory cell.

Figure 17:
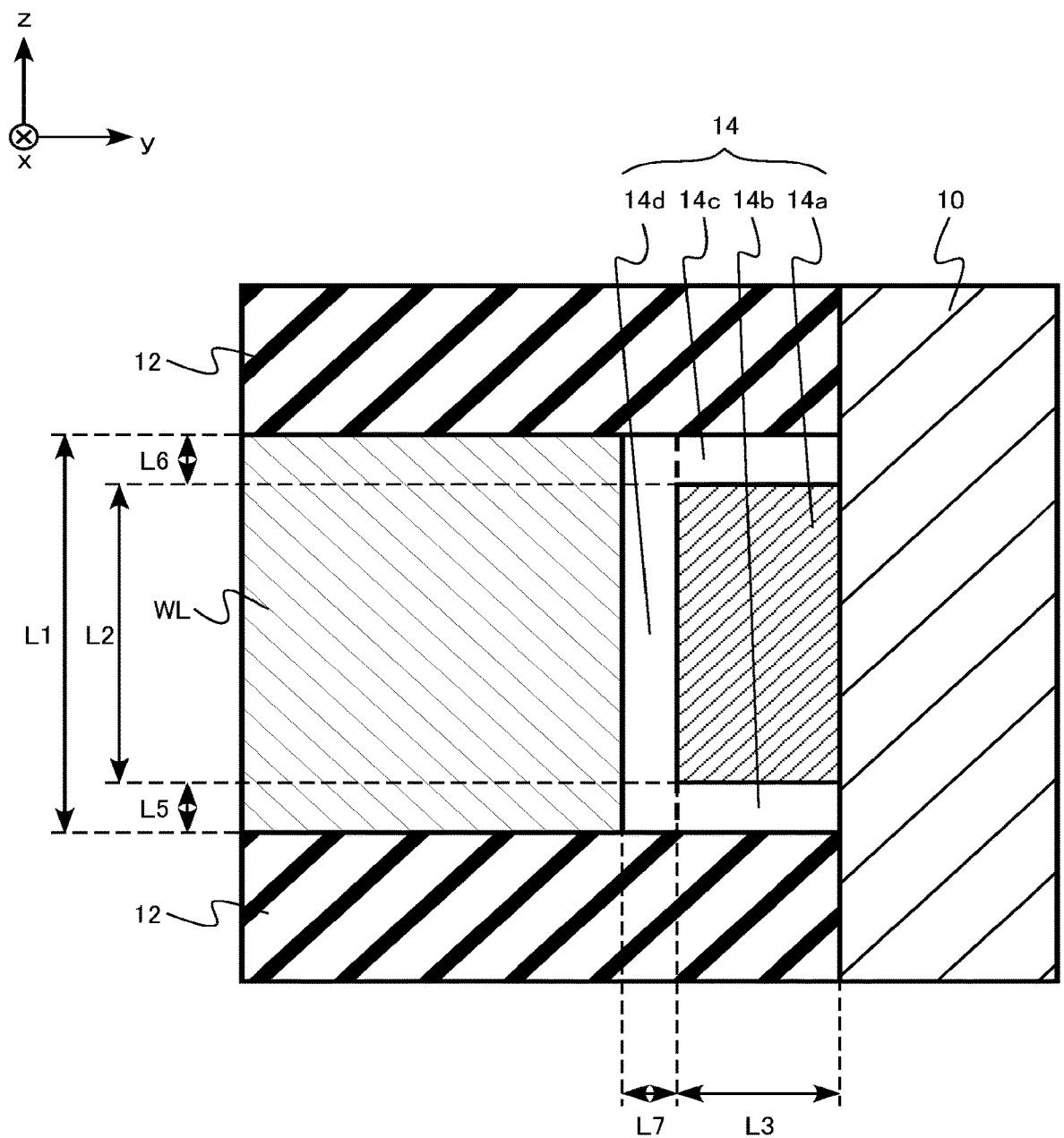
FIG. 17 is a schematic cross-sectional view of a memory cell of the semiconductor memory device according to the second embodiment.

FIG. 17 is a schematic cross-sectional view of a memory cell of the semiconductor memory device according to the second embodiment. FIG. 17 is an enlarged cross-sectional view of a portion of the memory cell. FIG. 17 is views corresponding to FIG. 3 of the semiconductor memory device according to the first embodiment.

As illustrated in FIGS. 16A, and 16B, the memory cell array 200 is configured to include: a plurality of word lines WL (gate electrode layers); a semiconductor layer 10; a plurality of interlayer insulating layers 12 (insulating layers); a gate insulating layer 14. The plurality of word lines WL and the plurality of interlayer insulating layers 12 constitute a stacked body 30. The gate insulating layer 14 includes a ferroelectric region 14a (first region), a first paraelectric region 14b (second region), a second paraelectric region 14c (third region), and a third paraelectric region 14d (fourth region).

As illustrated in FIG. 17, the memory cell includes a word line WL (gate electrode layer), a semiconductor layer 10, an interlayer insulating layer 12, and a gate insulating layer 14. The gate insulating layer 14 includes a ferroelectric region 14a (first region), a first paraelectric region 14b (second region), a second paraelectric region 14c (third region), and a third paraelectric region 14d (fourth region).

The third paraelectric region 14d is provided between the word line WL and the first region.

The third paraelectric region 14d (fourth region) contains a paraelectric material. The third paraelectric region 14d is made of a material different from that of the ferroelectric region 14a. The third paraelectric region 14d (fourth region), the first paraelectric region 14b, and the second paraelectric region 14c are made of the same material.

Third paraelectric region 14d contains a second oxide. The second oxide is a paraelectric material.

The second oxide contains, for example, at least one of the hafnium oxide and the zirconium oxide. The second oxide is mainly made of, for example, a material other than the orthorhombic crystal. A main crystal structure of the second oxide is a crystal structure other than the orthorhombic. The second oxide contains, for example, a crystal other than an orthorhombic crystal system. The second oxide is mainly made of, for example, a monoclinic crystal.

The seventh length L7 of the third paraelectric region 14d in the direction (y direction) from the word line WL toward the semiconductor layer 10 is, for example, 1 nm or more and 10 nm or less.

For example, the semiconductor memory device according to the second embodiment can be manufactured by omitting the process of etching and removing the first hafnium oxide film 56 illustrated in FIG. 13 in the method of manufacturing the semiconductor memory device according to the first embodiment.

When the ferroelectric region 14a is in direct contact with the word line WL, there is a concern in that oxygen may diffuse from the first oxide contained in the ferroelectric region 14a to the word line WL. When oxygen diffuses into the word line WL and, thus, the oxygen of the first oxide is reduced, the ferroelectricity of the ferroelectric region 14a is reduced. Therefore, there is a concern in that the memory cell characteristics may be degraded, and the reliability of the ferroelectric memory may be reduced.

In the semiconductor memory device according to the second embodiment, a third paraelectric region 14d is provided between the word line WL and the ferroelectric region 14a. Therefore, the ferroelectric region 14a is not indirect contact with the word line WL. Therefore, the diffusion of oxygen to the word line WL is suppressed, and the reliability of the ferroelectric memory is improved.

As described above, according to the semiconductor memory device according to the second embodiment, similarly to the first embodiment, the polarization of the memory cell is stabilized, and thus, the reliability can be improved. In addition, since the third paraelectric region 14d is provided, the reliability of the ferroelectric memory is further improved.

In the first and second embodiments, cases where the interlayer insulating layer 12 is provided between the word lines WL have been described as examples. However, the space between the word lines WL may be, for example, a cavity.

In the first and second embodiments, cases where the gate insulating layer 14 and the semiconductor layer 10 are in direct contact with each other have been described as examples. However, for example, an insulating film made of a material different from that of the gate insulating layer 14 may be provided between the gate insulating layer 14 and the semiconductor layer 10. The insulating film is made of, for example, a silicon oxide.

While certain embodiments have been described, these embodiments have been presented by way of example only, and are not intended to limit the scope of the inventions. Indeed, semiconductor memory devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a stacked body including gate electrode layers stacked in a first direction;
a semiconductor layer provided in the stacked body and extending in the first direction; and
a gate insulating layer provided between the semiconductor layer and at least one of the gate electrode layer, the gate insulating layer including a first region containing a first oxide including at least one of a hafnium oxide and a zirconium oxide, and main crystal structure of the first oxide being orthorhombic,
wherein a first length of the at least one of the gate electrode layer in the first direction is larger than a second length of the first region in the first direction, and
wherein the gate insulating layer includes a second region and a third region, the first region is provided between the second region and the third region, the first region faces the second region in the first direction, and the first region faces the third region in the first direction, the second region is made of a material different from that of the first region and contains a second oxide, a main crystal structure of the second oxide is a crystal structure other than orthorhombic, and a third region is made of the same material as that of the second region.

2. The semiconductor memory device according to claim 1, wherein the second oxide contains at least one of the hafnium oxide and the zirconium oxide.

3. The semiconductor memory device according to claim 1, wherein the gate insulating layer includes a fourth region provided between the at least one of the gate electrode layers and the first region, and the fourth region is made of the same material as that of the second region.

4. The semiconductor memory device according to claim 1, wherein the first oxide is a ferroelectric material, and the second oxide is a paraelectric material.

5. The semiconductor memory device according to claim 1, wherein a third length of the first region in a direction from the at least one of the gate electrode layers toward the semiconductor layer is 3 nm or more and 20 nm or less.

6. The semiconductor memory device according to claim 1, wherein the stacked body includes an insulating layer provided between two of the gate electrode layers adjacent to each other in the first direction.

7. The semiconductor memory device according to claim 1, wherein the first oxide includes hafnium oxide, the first oxide contains at least one element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba).

8. The semiconductor memory device according to claim 1, wherein the first oxide includes hafnium oxide, the first oxide contains at least one element selected from a group consisting of silicon (Si), zirconium (Zr), aluminum (Al), yttrium (Y), strontium (Sr), lanthanum (La), samarium (Sm), gadolinium (Gd), terbium (Tb), dysprosium (Dy), holmium (Ho), erbium (Er), ytterbium (Yb), lutetium (Lu), and barium (Ba) and the second oxide contains or does not contain the at least one element, and wherein a first concentration of the at least one element of the first oxide is different from a second concentration of the at least one element of the second oxide.

9. The semiconductor memory device according to claim 8, wherein the first concentration is higher than the second concentration.

* * * * *